United States Patent [19]

Cohn et al.

[11] Patent Number: 4,569,052
[45] Date of Patent: Feb. 4, 1986

[54] COSET CODE GENERATOR FOR COMPUTER MEMORY PROTECTION

[75] Inventors: Martin Cohn, Arlington; Terry A. Welch, Concord, both of Mass.; Abraham Lempel, Haifa, Israel

[73] Assignee: Sperry Corporation, New York, N.Y.

[21] Appl. No.: 513,895

[22] Filed: Jul. 14, 1983

[51] Int. Cl.$^4$ ............................................. G06F 11/10
[52] U.S. Cl. ...................................... 371/38; 371/42; 364/200
[58] Field of Search ................... 364/200, 900; 371/37, 371/38, 42

[56] References Cited

U.S. PATENT DOCUMENTS

3,466,601  9/1969  Tong ..................................... 371/42
3,550,082  12/1970 Tong ..................................... 371/42
4,271,520  6/1981  Coombes et al. ..................... 371/42

Primary Examiner—Michael R. Fleming
Attorney, Agent, or Firm—Howard P. Terry

[57] ABSTRACT

An apparatus for protecting computer memory utilizes a parity matrix to generate an n-k check bit signal of an extended linear (n,k,4) code from a k data bit signal. Exclusive-OR gates add the n-k check bit signal to an n-k tag bit signal selected from a predetermined class, to form, when concatenated with the k data bit signal, an element of a code of a certain class. The element comprising the k data bit signal is written in memory. A correction matrix or And gate cooperating with exclusive-OR gates detects an attempt to access the k data bit signal with an n-k key bit signal belonging to the same class as the n-k tag bit signal, but which does not match it.

58 Claims, 3 Drawing Figures

FIG. 2.

COSET CODE GENERATOR FOR COMPUTER MEMORY PROTECTION

BACKGROUND OF THE INVENTION

1. Field of the Invention

The present invention relates generally to the prevention of computer memory misuse, and more specifically to such prevention utilizing cosets generated from a linear code.

2. Description of the Prior Art

Computer designers have sought to append "tag" information for data protection in the randomly accessed main memory of electronic digital computers. Such tags consist of one or more bits of information appended to to each word of memory to identify its legal classes of usage and thus prevent misuse. However, this tagging mechanism has rarely been employed in a commercially successful computer due to the cost of providing extra bits of storage. For example, each tag bit in a 32-data-bit machine requires 3% additional storage. Since main memory is a significant aspect of the cost of a computer system, appending such tags can be economically prohibitive.

A majority of commercial computers utilize "keys" to safeguard memory (See, Introduction to Computer Architecture, Stone et al, Science Research Associates, Inc., Chicago, 2nd edition, 1980, p. 607). With this technique, each block of memory is equipped with a tag of typically 4 to 8 bits, and each user is provided with a key of the same dimension. The user's key must match the tag in order to read or write into a designated memory area. While extensively employed, this technique is wanting owing to coarse granularity, that is, the block of data associated with each tag is large, often a thousand words. The size of the blocks is dictated by the cost of storing the tags; storing the protection tag on each data word in order to utilize memory more flexibly, although desirable, has not been economically feasible.

A second type of memory protection utilizes a tag to distinguish various memory categories. For example, a one bit tag might differentiate raw data from machine instructions, precluding data manipulation operations from being wrongly applied to program code. Also, tags might be employed to distinguish "capabilities" or memory access rights from other varieties of memory words (See, Hardward Support For Memory Protection: Capability Implementations, M. V. Wilkes, Proceedings Symposium on Architectural Support For Programming Languages and Operation Systems, March 1982, Association for Computing Machinery, No. 556811, pp. 107-116) These categories of protection also entail the full expense attendant to the storage of extra bits. A "semi-tagged" alternative has been proposed (See, M. V. Wilkes, supra), but is of limited applicability, and engenders the loss of one information bit in tagged items.

Accordingly, there is a need for an apparatus which provides the benefits of tagging on a word-by-word basis without imposing the significant additional cost of storing extra bits.

SUMMARY OF THE INVENTION

The present invention an apparatus for protecting computer memory, which utilizes a class of mutually disjoint codes. The invention comprises coding means for receiving a k data bit signal and for generating in conjunction with the k data bit signal a linear (n, k, d) code signal. A generator means is employed for generating addend signals such that each distinct addend signal when added in exclusive-OR fashion to predetermined components of each of the $2^K$ signals comprising the linear (n, k, d) code generates $2^K$ distinct elements of a distinct member of a class of mutually disjoint codes. An addition means coupled to the coding means and the generator means is utilized for generating the exclusive-OR sums of the addend signals and the predetermined components of the signals comprising the linear (n, k, d) code. These sums are received by the computer's memory. The invention further comprises testing means coupled to the generator means, for detecting and indicating a mismatch between one of the addend signals from which an element of a member of one of the codes is derived, and one of the added signals utilized in an attempt to access the k data bit signal from which the element is derived.

One embodiment of the invention employs an extended linear (n, k, 4) code as the linear (n, k, d) code, and utilizes the extended linear (n, k, 4) code and its cosets of weight 2 as the class of mutually disjoint codes. This embodiment comprises a coding means for receiving a k data bit signal, and for generating an n-k check bit signal of the extended linear (n, k, 4) code from the k data bit signal. Addition means, coupled to the coding means, receives an n-k tag bit signal having even weight, and an n-k check bit signal generated from a k data bit signal received by the coding means. The addition means generates a first sum signal by performing exclusive-or addition of the n-k tag bit signal to the n-k check bit signal. The first sum signal and the k data bit signal from which the n-k check bit signal is generated are received in memory. Further, the addition means receives an n-k key bit signal having even weight, and an n-k check bit signal generated from the k data bit signal read from memory and received by the coding means. A second sum signal is generated by the addition means by performing exclusive-OR addition of the n-k key bit signal to the n-k check bit signal generated from the k data bit signal read from memory and received by the coding means. Testing means, coupled to the addition means, receives the first sum signal read from memory, and the second sum signal generated by the addition means, and detects and indicates a disparity of two bit signals between the first sum signal read from memory and the second sum signal.

In a preferred embodiment of the invention the coding means comprises a parity matrix, and the addition means comprises n-k exclusive-OR gates which add signals component-wise. The testing means comprises a second set of n-k exclusive-OR gates which generate the sums of corresponding components of the first sum signal read from memory and the second sum signal generated by the addition means. The testing means further comprises a correction matrix, coupled to the second set of exclusive-OR gates, which receives the sums generated by the second set of gates and detects and indicates a disparity of two bits.

Another embodiment of the invention employing cosets of weight 3 is essentially the same as the embodiment employing cosets of weight 2, but utilizes an n-k tag bit signal and an n-k key bit signal chosen from the set of two signals consisting of an all zero n-k bit signal and a fixed but arbitrary n-k bit signal having odd weight, whose n-k bits do not form a column of the correction matrix associated with the linear (n, k, 4) code.

The present invention exploits the existence of error checking and correcting coding mechanisms presently employed almost universally in computer main memories. Such coding mechanisms generate check bits which are appended to each memory word to detect and correct data errors caused by physical failures in the memory devices. This extant coding mechanism comprising a parity matrix for generating check bits and a correction matrix for detecting errors is utilized in the preferred embodiment of the present invention. Accordingly, the present invention provides the benefits of tagging on a word-by-word basis without imposing the significant additional cost of storing extra bits.

BRIEF DESCRIPTION OF THE DRAWINGS

Identical numerals in different figures refer to identical items.

DESCRIPTION OF THE PREFERRED EMBODIMENTS

Several preliminary definitions are helpful for an understanding of the present invention:

Binary Word:

A Binary Word is a sequence of binary digits ($0$'s or 1's) of finite length (dimension). For example, $01011101$ is a binary word of dimension 8.

Hamming Weight:

Hamming weight is the number of ones in a binary word. For example, the Hamming weight of $01011101$ is 5, since it possesses 5 ones.

Hamming Distance:

The Hamming distance between two binary words of equal dimension is the number of positions wherein the words differ. For example, the Hamming distance between $10100111$ and $01101011$ is four, since these binary words differ in their first, second, fifth and sixth positions.

Exclusive-OR Addition:

Exclusive-OR Addition, denoted $\oplus$, is an operation between two binary digits (bits) with the following properties:

$0 \oplus 0 = 0$ $0 \oplus 1 = 1$ $1 \oplus 0 = 1$ $1 \oplus 1 = 0$

That is, the Exclusive-OR sum of two bits is 1 when the bits differ, and $0$ when they are the same. Exclusive-OR Addition is also known as symmetric difference, or modulo-2 (mod-2) sum.

Parity of a Binary Word:

The parity of a binary word is the Exlusive-OR sum of its components. For example, the parity of $10111$ is $0$ since $1 \oplus 0 \oplus 1 \oplus 1 \oplus 1 = 0$. The parity of $1010 1$ is 1 since $1 \oplus 0 \oplus 1 \oplus 0 \oplus 1 = 1$. If the Hamming weight of a word is an even number, the word will have a parity of zero; if the Hamming weight of a word is an odd number, the word will have a parity of one.

Group:

A group is a set of objects, called elements, among which an operation is defined. The operation, applied to two elements in the group, produces an element in the group. The Group operation, denoted "$\oplus$", possess the following properties:

1. There is an identity element in the group, Denoted E, such that for any element A in the group $E \oplus A = A$.
2. For each element B in the group, there is an inverse element in the group, denoted $B^{-1}$, such that $B^{-1} \oplus B = E$.
3. Associativity holds, that is, if X, Y, and Z are arbitrary elements in the group, then $X \oplus (Y \oplus Z) = (X \oplus Y) \oplus Z$.

Subgroup:

A subgroup is a subset of a group which is also a group.

Coset:

A coset is a set of elements in a group formed by applying the group operation between a fixed element of the group and each of the elements of a subgroup. For example, if M, N, O, P, Q and R form a group under the operation "$\oplus$", and if P, Q, and R form a subgroup, then, the elements of a coset formed by applying the group operation to N and each of the elements of the subgroup are: $N \oplus P$, $N \oplus Q$, and $N \oplus R$.

Linear Code:

A linear code is a set of binary words of equal dimension which forms a group under component-wise Exclusive-OR addition, such that the Hamming distance between any two words is not less than some predetermined number.

A linear code may be constructed by appending specially selected bits, called check bits, to data (information) bits. For example, a linear code of dimension 6 may be constructed from the data bits $00$, $01$, $10$ and $11$ by appending, respectively, the check bits $0000$, $1101$, $0111$ and $1010$. The resulting words $000000$, $011101$, $100111$ and $111010$, form a group under component-wise Exclusive-OR addition; the addition of any two words in the set produces a word in the set. For example, adding the second word in the set, $011101$, to the fourth word in the set, $111010$, denoted $011101 \oplus 111010$, produces $100111$, the third word in the set. This follows from adding the respective components of the two words: $0 \oplus 1 = 1$, $1 \oplus 1 = 0$, $1 \oplus 1 = 0$, $1 \oplus 0 = 1$, $0 \oplus 1 = 1$, and $1 \oplus 0 = 1$. Similarly, $011101 \oplus 100111 = 111010$, the fourth word in the set; and, $100111 \oplus 111010 = 011101$, the second word in the set. Taking all possible combination of two words, one can confirm that the sum of any two words in the set produces a word in the set.

The word $000000$ in the set is an identity element, that is, adding $000000$ to any word in the set produces that same word. For example, $000000 \oplus 011101 = 011101$. Similarly, $000000 \oplus 100111 = 100111$. The identity property follows simply from the fact that $0 \oplus 0 = 0$ and $0 \oplus 1 = 1$, that is, addition of "$0$" to a bit produces that same bit.

Each word in the set serves as its own inverse, that is, adding a word to itself produces the identity element, $000000$. For example, $100111 \oplus 100111 = 000000$; and $111010 \oplus 111010 = 000000$. The inverse property follows simply from the fact that $\emptyset \oplus \emptyset = \emptyset$ and $1 \oplus 1 = \emptyset$, that is, the addition of the same bits produces zero.

Addition of words in the set possesses the associative property; that is, for any words A, B and C in the set, $A \oplus (B \oplus C) = (A \oplus B) \oplus C$. For example, $\emptyset 111 \emptyset 1 \oplus (1 \emptyset \emptyset 111 \oplus 111 \emptyset 1 \emptyset) = \emptyset 111 \emptyset 1 \oplus \emptyset 11 1 \emptyset 1 = \emptyset \emptyset \emptyset \emptyset \emptyset$; and $(\emptyset 111 \emptyset 1 \oplus 1 \emptyset \emptyset 111) \oplus 111 \emptyset 1 \emptyset = 111 \emptyset 1 \emptyset \oplus 111 \emptyset 1 \emptyset = \emptyset \emptyset \emptyset \emptyset \emptyset \emptyset$. Similarly, $\emptyset \emptyset \emptyset \emptyset \emptyset \emptyset \oplus (1 \emptyset \emptyset 111 \oplus 111 \emptyset 1 \emptyset) = \emptyset \emptyset \emptyset \emptyset \emptyset \emptyset \oplus \emptyset 11 1 \emptyset 1 = \emptyset 111 \emptyset 1$; and, $(\emptyset \emptyset \emptyset \emptyset \emptyset \emptyset \oplus 1 \emptyset \emptyset 111) \oplus 111 \emptyset 1 \emptyset = 1 \emptyset \emptyset 111 \oplus 111 \emptyset 1 \emptyset = \emptyset 111 \emptyset 1$. Associativity of addition for the words in the set follows from the associativity of addition for bits. By checking each of the eight possible combinations of bits ($\emptyset \emptyset \emptyset$, $\emptyset \emptyset 1$, $\emptyset 1 \emptyset$, etc.) for associativity of addition ($\emptyset \oplus (\emptyset \oplus \emptyset) = (\emptyset \oplus \emptyset) \oplus \emptyset$, $\emptyset \oplus (\emptyset \oplus 1) = (\emptyset \oplus \emptyset) \oplus 1$, etc.), the property may be verified.

Thus, the set of words forms a group under Exclusive-OR addition.

The Hamming distance between each two words in the Group is 4. For example, the Hamming distance between $\emptyset 111 \emptyset 1$ and $111 \emptyset 1 \emptyset$ is 4 since the words differ in 4 positions. Similarly, the Hamming distance between $1 \emptyset \emptyset 111$ and $111 \emptyset 1 \emptyset$ is 4 since the words differ in 4 positions.

With the establishment of the above characteristics, the set of equal dimension binary words so constructed is seen to be a linear code, that is, a group under component-wise Exclusive-OR addition with a predetermined minimal distance between words.

A linear code contrived in this fashion is denoted a linear (n, k, d) code, where n = the dimension of a word, k = the number of data bits in a word, and d = the minimum Hamming distance between words. There are a total of $2^K$ words in such a linear code. This follows from the fact that the code words are constructed by appending n-k suitably selected check bits to each of the $2^K$ data words generated from the k data bits.

Single error correcting linear code:

A single error correcting linear code is a linear code wherein the minimum Hamming distance between words is 3. A single error in any word of the code may be detected and corrected by conventional error checking and correcting coding mechanisms.

Single error correcting and double error detecting linear code:

A single error correcting and double error detecting linear code is a linear code wherein the minimum Hamming distance between words is 4. Conventional error checking and correcting coding mechanisms permit a single error in any code word to be detected and corrected, and a double error in any code word to be detected.

Parity matrix:

A parity matrix is an apparatus for generating the n-k check bits of a linear (n, k, d) code from k data bits.

Correction matrix (Parity check matrix):

A correction matrix is an apparatus for detecting discrepancies in the check bits of data words written into and read from memory, thereby detecting discrepancies in the data words themselves.

Most efficient linear (n, k, d) code:

A most efficient linear (n, k, d) code is a linear (n, k, d) code in which for a given k and d the wordlength n is as small as possible, or, equivalently, for a given n and d, k is as large as possible.

The invention entails the use of cosets of a linear code in order to provide error control and to protect against the misuse of data belonging to different users or intended for different functions while stored in a common memory.

In accordance with the principles of the present invention, a linear (n−1, k, 3) single error correcting code is extended to a linear (n, k, 4) single error correcting and double error detecting code by appending to each linear (n−1, k, 3) code word the parity of that word. The linear (n, k, 4) code has $2^{N-K}$ cosets, each formed by adding one of the $2^{N-K}$ n dimensional vectors having zeros in the first k places to each of the words of the code. Since the linear (n, k, 4) code is formed by concatenating the parity bit of a word to that word, each of the code's $2^K$ words has even weight. An odd weight word plus an even weight word yields an odd weight word, and an even weight word plus an even weight word yields an even weight word. Accordingly, a coset contains only odd weight words or only even weight words. The least weight of the words in a coset is termed the weight of the coset.

The distance between two binary words $B_1$ and $B_2$, denoted $d(B_1, B_2)$ is simply the weight of their sum, denoted $w(B_1 \oplus B_2)$. The distance between arbitrary words $C_1$ and $C_2$ of the linear (n, k, 4) code is at least four, by the properties of the code. Thus, $d(C_1, C_2) = w(C_1 \oplus C_2) \geq 4$. For the coset generated from the linear (n, k, 4) code by adding a vector, V, to each of the code words, the distance between arbitrary coset words $C_1 \oplus V$ and $C_2 \oplus V$, denoted $d(C_1 \oplus V, C_2 \oplus V)$ is just $w((C_1 \oplus V) \oplus (C_2 \oplus V)) = w(C_1 \oplus V \oplus C_2 \oplus V) = w(C_1 \oplus V \oplus V \oplus C_2) = w(C_1 \oplus \emptyset \oplus C_2) = w(C_1 \oplus C_2) \geq 4$. Thus, any two words of the coset are at least distance 4 from each other. Each of the cosets derived from the linear (n, k, 4) code is, therefore, single error correcting and double error detecting. Further, no two of the cosets have a word in common: denoted an arbitrary word in one coset by $C_1 \oplus V_1$, an arbitrary word in another coset by $C_2 \oplus V_2$, where $V_2 \neq V_1$, assume $C_1 \oplus V_1 = C_2 \oplus V_2$. Adding $C_2 \oplus V_1$, to each side of the equation produces $C_2 \oplus C_1 = V_1 \oplus V_2$. If $C_1 = C_2$, then $\emptyset = V_1 \oplus V_2$. But, $V_1 \neq V_2$, showing this to be impossible. If $C_1 \neq C_2$ then $C_1$ and $C_2$ differ in their first k data bits, and thus the first k bits of $C_1 \oplus C_2$ are not all zero. However, the first k bits of $V_1 \oplus V_2$ are all zero since the first k bits of both $V_1$ and $V_2$, as indicated above, are selected to be all zero. Thus, $C_2 \oplus C_1$ cannot equal $V_1 \oplus V_2$. The contradiction signifies that the assumption that two cosets have an equal member must be false, thereby verifying the original assertion that no two cosets have a word in common.

The invention utilizes cosets as codes, particularly those of weight 2. Since the minimum distance between words within a coset is 4, each of the cosets is single-error correcting and double error detecting. For cosets of weight two, since no two cosets have a word in common and all their members have even weight, the minimum distance between these codes is at least two.

If the original linear (n, k, 4) code is a most efficient code, there can be no coset of weight 4 or more, for if there were one such, its union with the linear code would form a linear (n, k+1, 4) code, which by the assumption of efficiency is impossible.

If the last bit is discarded from the words of the cosets of weight 3, they form cosets of weight 2 or 3 of the unextended linear (n−1, k, 3) code. This code has minimum distance 3 between words and is also efficient so that it cannot have cosets of weight 3 or more. The unextended code has one coset of weight 0 (the code itself), n−1 cosets of weight 1, and therefore $2^{N-1-K}-n$ cosets of weight 2 (provided, of course, the number is positive). This number is thus also the number of cosets of weight 3 for the extended code. Since the linear (n, k, 4) code has n cosets of weight one, and a single coset of weight zero (the code itself), there are $2^{N-K}-((2^{N-1-K}-n)+n+1))=2^{N-K-1}-1$ cosets of weight 2. Therefore, counting the linear (n, k, 4) code itself, there is a class of $2^{N-K-1}$ codes with intracode distance 4, and intercode distance 2. Utilizing these codes, $2^{N-K-1}$ users or functions can be served with single-error correction, double-error and code-misuse detection.

The cosets of weight 3 contain only odd weight words, so that the intercode distance among them must be even. This distance cannot be 4 or more, since then a coset of weight 4 or more could be constructed. Thus, the distance must be two. Accordingly, there are at most two codes, namely, the linear (n, k, 4) code and an arbitrary coset of weight 3, which have intercode distance 3, and thereby possess single-error correction, double-error detection and misuse recognition.

In summary, there exist $2^{N-K-1}$ codes of intracode distance 4 and intercode distance 2 so that single errors are correctable, and double errors or code misuse are detectable. If $2^{N-K-1} \geq n$, there exist a pair of codes with intracode distance 4, intercode distance 3, so that single errors are correctable, double errors are detectable and code misuse is recognizable.

The distinction between the two above cases in dealing with code misuse is that the first case cannot distinguish between double errors and code misuse, while the second case can. The inability in the first case is not a serious drawback, since the usual response to an uncorrectable error is to halt processing in order to retry or to diagnose.

The cosets utilized as codes may readily be counted and constructed. A coset of weight two is formed by adding to the linear (n,k,4) code any even weight word not in the code, since minimum weight 4 or more is impossible. To get all $2^{N-K-1}-1$ cosets of weight two, the syndromes of the additive words must all be distinct (the syndrome of a vector is its product by the correction (parity-check) matrix). This is accomplished by the following construction:

The additive words for generating all cosets of weight 2 are those with 0 in all data bit positions and any even-weight combination of 1's in the check bit positions. Because the columns of the correction (parity-check) matrix in the check-bit positions form a nonsingular matrix, the syndromes of these vectors are all distinct.

The additive words that form cosets of weight three consist of odd weight words that do not occur in any coset of weight one. This word can be chosen to be 0 in all the data bit positions, and in the check bit positions any odd weight pattern that does not appear as some column of the correction (parity-check) matrix. The resulting coset is of odd weight, and its syndrome cannot be the same as the syndrome of any weight one coset, whose syndromes are precisely the columns of the correction (parity-check) matrix. Thus, since the coset weight is odd, it must be three or more.

From the linearity of the above construction, it follows that the encoding and decoding of all the coset codes is accomplished by the same parity-checking logic appropriate for the original linear (n,k,4) code.

Figure 1:
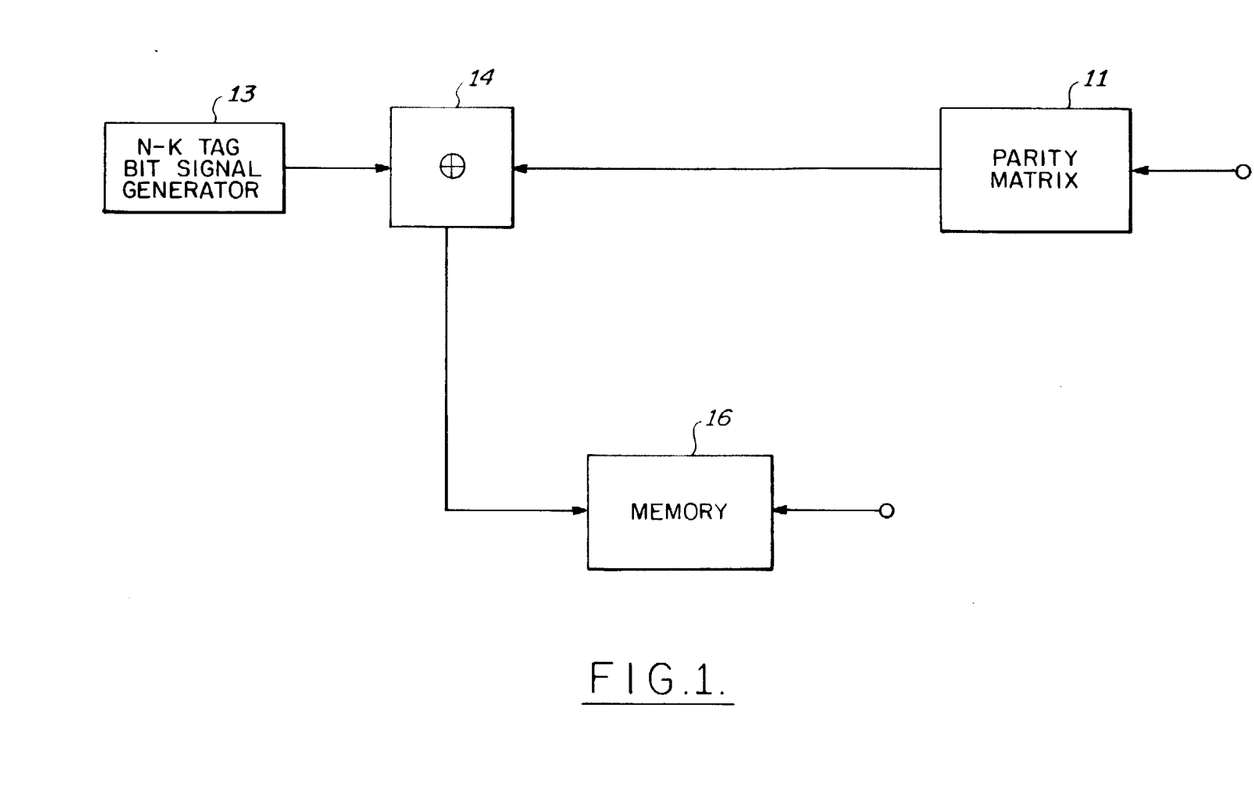
FIG. 1 is a block diagram of the write-in-memory operation of a preferred embodiment of the invention.

The above principles are implemented in preferred embodiments of the invention. Referring to FIG. 1, the write operation of the preferred embodiment of the invention employing cosets of weight 2 is depicted. A k data bit signal is conveyed to a parity matrix 11. The parity matrix 11 generates an n-k check bit signal of an extended linear (n,k,4) code from the k data bit signal. A signal generator 13 produces an n-k tag bit signal having even weight. The n-k tag bit signal having even weight is either zero or the last n-k bits of one of the $2^{N-K-1}-1$ dimensional words having k zeros in the data positions, which, when added to the linear (n,k,4) code, generates a coset of weight 2. The n-k tag bit signal having even weight is received, along with the n-k check bit signal generated by the parity matrix 11, by an exclusive-OR adder 14. The exclusive-OR adder 14 preferably comprises a first set of n-k exclusive-OR gates. Each of the exclusive-OR gates receives and adds the corresponding components of the n-k tag bit signal and the n-k check bit signal. Exclusive-OR adder 14 generates a first sum signal. As shown above, the first sum signal when concatenated with the k data bit signal forms an element of one of the $2^{N-K-1}$ codes having intracode distance 4 and intercode distance 2. These $2^{N-K-1}$ codes comprise the linear (n,k,4) code and its $2^{N-K-1}-1$ cosets of weight 2. The first sum signal generated by adder 14 is received by a memory 16, and the k data bit signal is also received by the memory 16.

Figure 2:
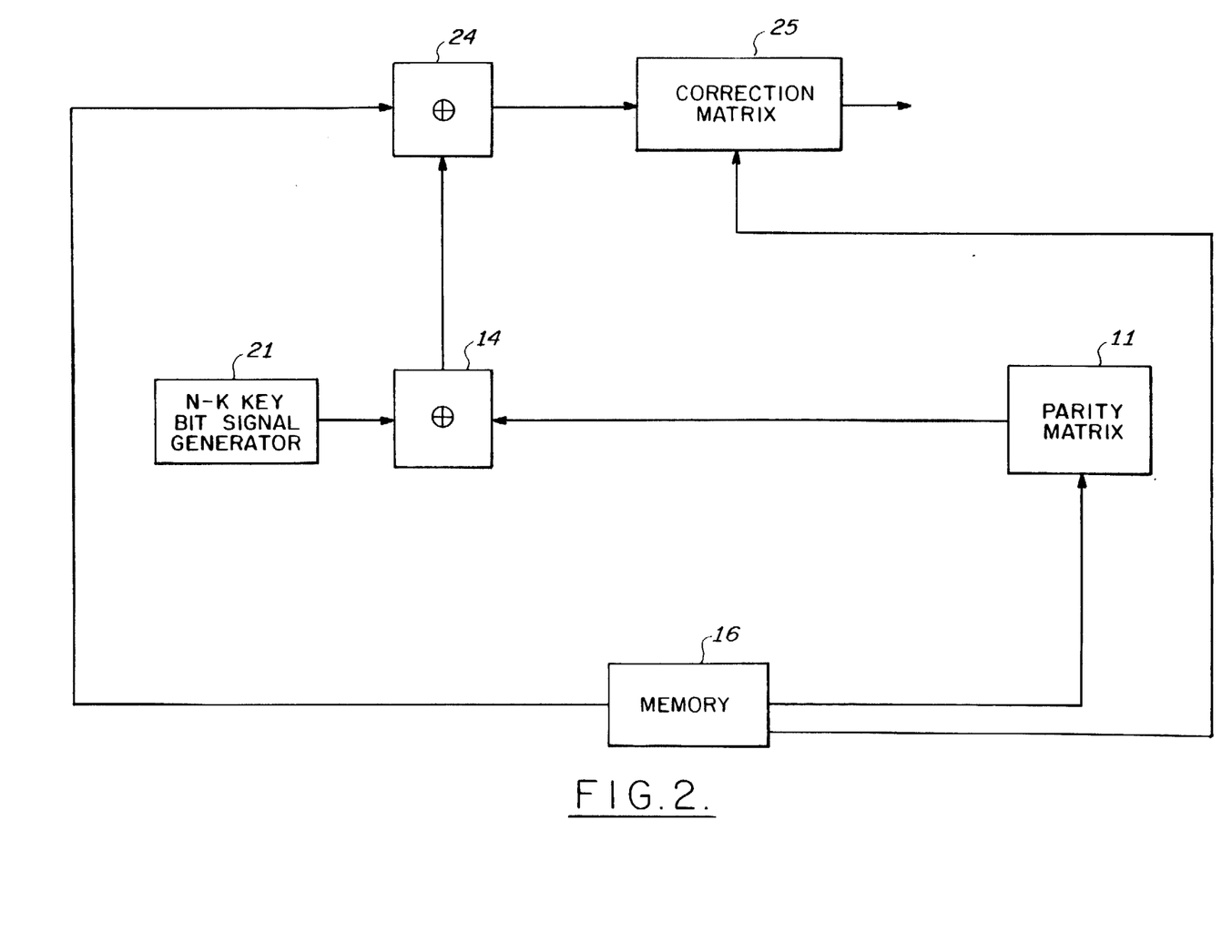
FIG. 2 is a block diagram of the read-from-memory operation of a preferred embodiment of the invention.

Referring to FIG. 2 with continuing reference to FIG. 1, the read operation of the preferred embodiment of the invention employing cosets of weight 2 is depicted. The n-k data bit signal which was written in the memory 16 is retrieved from the memory 16 as a read k data bit signal which is received by the parity matrix 11. The parity matrix 11 generates an n-k check bit signal of an extended linear (n,k,4) code from the read k data bit signal. A signal generator 21 produces an n-k key bit signal having even weight. The n-k key bit signal belongs to the same class of signals as the N-K tag bit signal. Either the n-k key bit signal is the same as the n-k tag bit signal used at the time of writing the data, indicating a legitimate attempt to access the k data bit signal from the memory 16, or the n-k key bit signal differs from the n-k tag bit signal, indicating an improper attempt to access the k data bit signal from the memory 16. The n-k key bit signal is received, along with the n-k check bit signal derived from the read k data bit signal, by the exclusive-OR adder 14. A second sum signal is generated by the exclusive-OR adder 14. As shown above, the second sum signal when concatentated with the read k data bit signal forms an element of one of the $2^{N-K-1}$ codes with intracode distance 4 and intercode distance 2 comprising the linear (n,k,4) code and its $2^{N-K-1}-1$ cosets of weight 2. The first sum signal which was written in the memory 16 is retrieved from the memory 16 as a read first sum signal. The read first sum signal, and the second sum signal which is generated by the adder 14, are received by the exclusive-OR adder 24. The exclusive-OR adder 24 preferably comprises a second set of n-k exclusive-OR gates. Each of the exclusive-OR gates receives and adds the corresponding components of the read first sum signal and the second sum signal. The output of the exclusive-OR adder 24 is received by a correction matrix 25. If there is no disparity between the read first sum signal and the second sum signal, the correction matrix 25 so detects and indicates. No disparity signifies that the n-k key bit signal matches the n-k tag bit signal. If there is a disparity of an even number of bit signals between the read first sum signal and the second sum signal, the correction matrix 25 so detects and indicates. Such a disparity may arise when the key bit signal matches the tag bit signal but errors have occurred in retrieving the k data bit signal from the memory 16, or when the key bit signal does not match the tag bit signal. Thus, an improper attempt to access the k data bit signal written in the memory 16 will be detected by the correction matrix 25. That is, if one of the $2^{N-K-1}$ n-k key bit signals having even weight, other than the n-k tag bit signal, is employed in an attempt to read the k data bit signal from the memory 16, the correction matrix 25 will detect the mismatch. When the output of the exclusive-OR adder 24 is received by the correction matrix 25, the correction matrix 25 also has the capacity to detect a single disparity between the read first sum signal and the second sum signal. Such a disparity indicates an error has occurred in retrieving the k data bit signal from the memory 16. If the read k data bit signal is received by the correction matrix 25, the matrix can correct the error.

Figure 3:
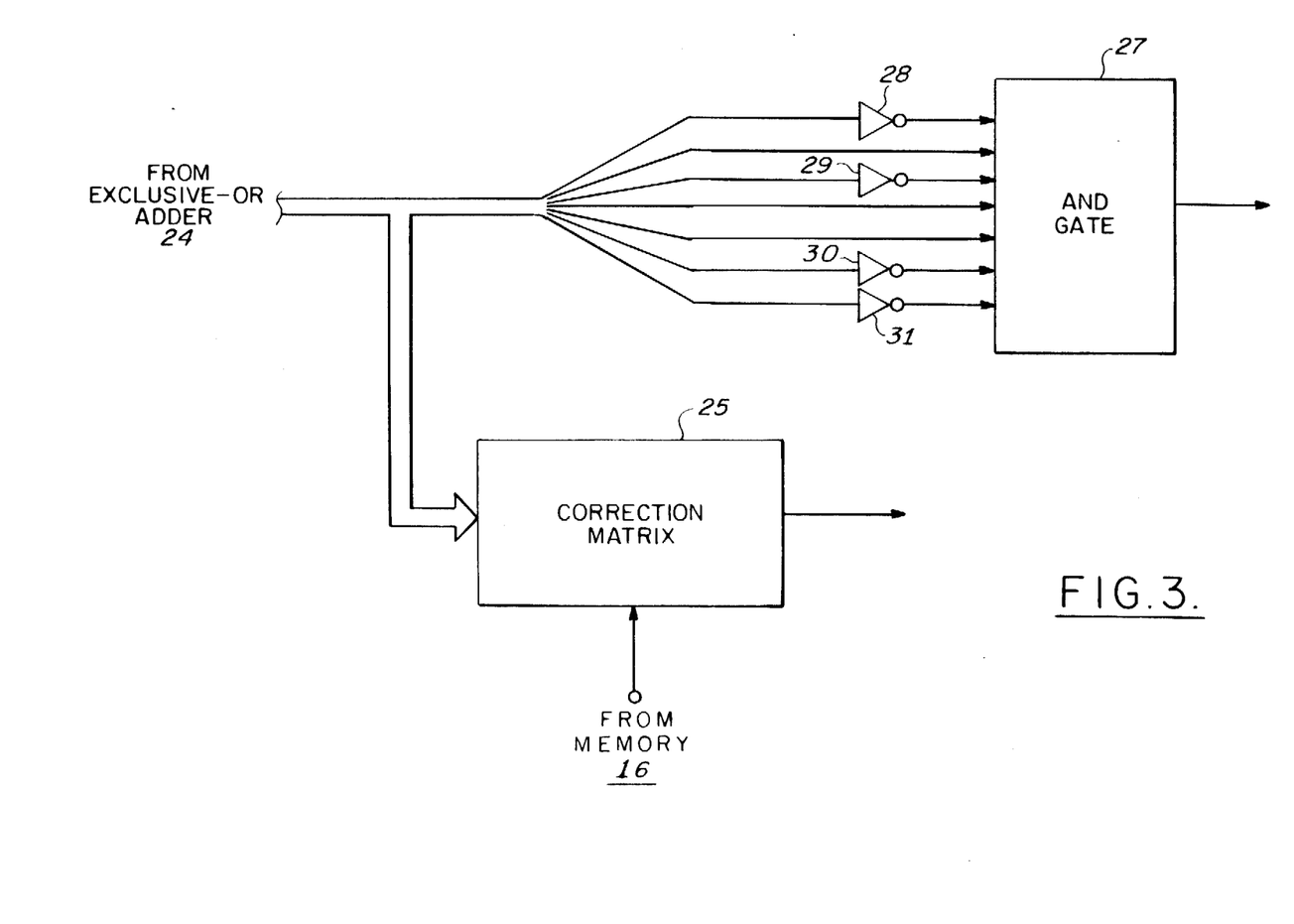
FIG. 3 is a block diagram of the mismatch/error detection mechanism of a preferred embodiment of the invention.

A preferred embodiment of the invention employing cosets of weight 3 is constructed in essentially the same manner as that of the embodiment employing cosets of weight 2, with the differences detailed below. Referring to FIG. 1, the n-k tag bit signal produced by the generator 13 is selected from the set of two signals comprising an all zero n-k bit signal and a fixed but arbitrary n-k bit signal having odd weight, whose n-k bits do not form a column of the correction matrix corresponding to the linear (n,k,4) code. The non-zero n-k bit signal is the last n-k bits of an n dimensional word having k zeros in the data positions, which when added to the linear (n,k,4) code generates a coset of weight 3. Accordingly, the first sum signal concatenated with the k data bit signal forms an element of one of the 2 codes having intracode distance 4 and intercode distance 3, comprising the linear (n,k,4) code and a fixed but arbitrary coset of weight 3 of the linear (n,k,4) code. Referring to FIG. 2, the n-k key bit signal produced by the generator 21 belongs to the same set of two signals as the n-k tag bit signal. As before, either the n-k key bit signal matches the n-k tag bit signal, indicating a legitimate attempt to access the k data bit signal from the memory 16, or there is a mismatch signifying an improper attempt to acquire access. Referring to FIG. 3 with continuing reference to FIG. 2, in this embodiment the output of the exclusive-OR adder 24 comprising the sum of the read first sum signal and the second sum signal is received by And gate 27 after predetermined components of the output signal have passed through inverters such as 28, 29, 30 and 31. The output of the exclusive-OR adder 24 is also received by the correction matrix 25. If there is no disparity between the read first sum signal and the second sum signal, the correction matrix 25 so detects and indicates. No disparity signifies that the n-k key bit signal matches the n-k tag bit signal.

The components of the output of the exclusive-OR adder 24 received by And gate 27 which are inverted correspond to the zero components of the fixed but arbitrary n-k bit signal having odd weight, whose n-k bits do not form a column of the correction matrix 25 associated with the linear (n,k,4) code. If the n-k key bit signal does not match the n-k tag bit signal, the output of the exclusive-OR adder 24 will simply be the above fixed but arbitrary signal which will be of odd weight not less than 3. By inverting the zero components of the non-zero signal, a signal comprising all ones is received by the And gate 27, which so registers and thereby indicates a mismatch.

As before, when the output of the exclusive-OR adder 24 is received by the correction matrix 25, the correction matrix 25 also has the capacity to detect a single or double disparity between the read first sum signal and the second sum signal. Such a disparity indicates errors have occurred in retrieving the k data bit signal from the memory 16. If the read k data bit signal is received by the correction matrix 25, the matrix can correct a single such error.

The present invention may be stated in more general terms:

The invention comprises a means for generating linear (n,k,d) code signals from data bit signals. A means is utilized for generating addend signals having certain properties: each addend signal when added to predetermined components of each of the $2^K$ signals comprising the linear (n,k,d) code generates $2^K$ distinct signals forming a code Distinct addend signals generate, from the linear (n,k,d) code, distinct members of a class of mutually disjoint codes. A means is employed for generating the exclusive-OR sums of the addend signals and the predetermined components of the signals comprising the linear (n,k,d) code. These sums are received by the computer memory. The invention further comprises a means for detecting and indicating a mismatch between one of the addend signals from which an element of a member of the mutually disjoint codes is derived, and one of the addend signals utilized in an attempt to access the data bit signal from which that element was derived.

Utilizing an extended linear (n,k,4) code as the linear (n,k,d) code, and utilizing addend signals which generate codes comprising cosets of weight 2 or 3 of the extended linear (n,k,4) code, allow the present invention, as shown above, to exploit the error checking and correcting mechanisms inherent in almost all computers.

The apparatuses employed in the preferred embodiments of the invention, that is, the parity matrix, the exclusive-OR gates, the correction matrix, and the AND gate are all available commercially.

The tag bit signal and key bit signal generators generally comprise part of the computer operating system with which the preferred embodiments of the invention are employed. Such signal generators are well-known in the art. The dimension of the data bit signals utilized in the invention is preferably 36; but, powers of two, especially, 8, 16, and 32 are also of particular interest.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. An apparatus for protecting computer memory using coset codes of weight 2 comprising:
   coding means for receiving a k data bit signal, and for generating an n-k check bit signal of an extended linear (n,k,4) code from said k data bit signal;
   first generator means for providing an n-k tag bit signal having even weight;

second generator means for providing an n-k key bit signal having even weight;

addition means, coupled to said coding means and said first and second generator means, for receiving said n-k tag bit signal, and an n-k check bit signal generated from a k data bit signal received by said coding means, and for generating a first sum signal by performing exclusive-OR addition of said n-k tag bit signal to said n-k check bit signal, said first sum signal and said k data bit signal from which said n-k check bit signal is generated being received by said computer memory, said addition means further for receiving said n-k key bit signal, and an n-k check bit signal generated from said k data bit signal read from said memory and received by said coding means, and for generating a second sum signal by performing exclusive-OR addition of said n-k key bit signal to said n-k check bit signal generated from said k data bit signal read from said computer memory and received by said coding means; and testing means, coupled to said addition means, for receiving said first sum signal read from said memory, and for receiving said second sum signal generated by said addition means, and for detecting and indicating a disparity of an even number of bit signals between said first sum signal read from said memory and said second sum signal.

2. An apparatus as in claim 1 wherein said coding means comprises a parity matrix.

3. An apparatus as in claim 2 wherein said addition means comprises a first set of n-k exclusive-OR gates, each of said gates of said first set generating an exclusive-OR sum of corresponding components of received signals.

4. An apparatus as in claim 3 wherein said testing means comprises a second set of n-k exclusive-OR gates, each of said gates of said second set receiving and generating an exclusive-OR sum of corresponding components of said first sum signal read from said memory and said second sum signal generated by said addition means; and a correction matrix, coupled to said second set of exclusive-OR gates, which receives said exclusive-OR sums generated by said second set of exclusive-OR gates and detects and indicates a disparity of an even number of bit signals between said first sum signal read from said memory and said second sum signal.

5. An apparatus as in claim 4 wherein k is a power of 2.

6. An apparatus as in claim 4 wherein k is 8.

7. An apparatus as in claim 4 wherein k is 16.

8. An apparatus as in claim 4 wherein k is 32.

9. An apparatus as in claim 4 wherein k is 36.

10. An apparatus as in claim 1 wherein k is a power of 2.

11. An apparatus as in claim 1 wherein k is 8.

12. An apparatus as in claim 1 wherein k is 16.

13. An apparatus as in claim 1 wherein k is 32.

14. An apparatus as in claim 1 wherein k is 36.

15. An apparatus as in claim 1 wherein said testing means is additionally for receiving said k data bit signal read from said memory, and for detecting and indicating a disparity of one bit signal between said first sum signal read from said memory and said second sum signal, and for correcting an error in said k data bit signal read from said memory which said disparity of one bit signal signifies.

16. An apparatus as in claim 15 wherein said coding means comprises a parity matrix.

17. An apparatus as in claim 16 wherein said addition means comprises a first set of n-k exclusive-OR gates, each of said gates of said first set generating an exclusive-OR sum of corresponding components of received signals.

18. An apparatus as in claim 17 wherein said testing means comprises a second set of n-k exclusive-OR gates, each of said gates of said second set receiving and generating an exclusive-OR sum of corresponding components of said first sum signal read from said memory and said second sum signal generated by said addition means; and a correction matrix, coupled to said second set of exclusive-OR gates, which receives said exclusive-OR sums generated by said second set of exclusive-OR gates, receives said k data bit signal read from said memory, detects and indicates a disparity of an even number of bit signals between said first sum signal read from said memory and said second sum signal, detects and indicates a disparity of one bit signal between said first sum signal read from said memory and said second sum signal, and corrects an error in said k data bit signal read from said memory which said disparity of one bit signifies.

19. An apparatus as in claim 18 wherein k is a power of 2.

20. An apparatus as in claim 18 wherein k is 8.

21. An apparatus as in claim 18 wherein k is 16.

22. An apparatus as in claim 18 wherein k is 32.

23. An apparatus as in claim 18 wherein k is 36.

24. An apparatus as in claim 15 wherein k is a power of 2.

25. An apparatus as in claim 15 wherein k is 8.

26. An apparatus as in claim 15 wherein k is 16.

27. An apparatus as in claim 15 wherein k is 32.

28. An apparatus as in claim 15 wherein k is 36.

29. An apparatus for protecting computer memory using coset codes of weight 3 comprising:

coding means for receiving a k data bit signal and for generating an n-k check bit signal of an extended linear (n,k,4) code from said k data bit signal;

first generator means for providing an n-k tag bit signal chosen from a set of two signals consisting of an all zero n-k bit signal and a fixed but arbitrary n-k bit signal having odd weight, whose n-k bits do not form a column of a correction matrix corresponding to said linear (n,k,4) code;

second generator means for providing an n-k key bit signal chosen from said set of two signals;

addition means, coupled to said coding means and said first and second generator means, for receiving said n-k tag bit signal, and an n-k check bit signal generated from a k data bit signal received by said coding means, and for generating a first sum signal by performing exclusive-OR addition of said n-k tag bit signal to said n-k check bit signal, said first sum signal, and said k data bit signal from which said n-k check bit signal is generated being received by said computer memory, said addition means further for receiving said n-k key bit signal, and an n-k check bit signal generated from said k data bit signal read from said memory and received by said coding means, and for generating a second sum signal by performing exclusive-OR addition of said n-k key bit signal to said n-k check bit signal generated from said k data bit signal read from said computer memory and received by said coding means; and testing means, coupled to said addition means, for receiving said first sum signal read from said memory and for receiving said second sum signal generated by said addition means, and for detecting and indicating a disparity of an odd number, not less than 3, of bit signals between said first sum signal read from said memory and said second sum signal.

30. An apparatus as in claim 29 wherein said coding means comprises a parity matrix.

31. An apparatus as in claim 30 wherein said addition means comprises a first set of n-k exclusive-OR gates, each of said gates of said first set generating an exclusive-OR sum of corresponding components of received signals.

32. An apparatus as in claim 31 wherein said testing means comprises:
- a second set of n-k exclusive-OR gates, each of said gates of said second set receiving and generating an exclusive-OR sum of corresponding components of said first sum signal read from said memory and said second sum signal generated by said addition means;
- inverting means, coupled to said second set of n-k exclusive-OR gates, for inverting said sums generated by said second set of exclusive-OR gates which correspond in position to zero components of said fixed but arbitrary n-k bit signal having odd weight, whose n-k bits do not form a column of a correction matrix corresponding to said linear (n,k,4) code; and
- And gate means, coupled to said inverting means and said second set of exclusive-OR gates, for receiving said inverted sums, and said sums generated by said second set of exclusive-OR gates which are not inverted, and for detecting and indicating when all received signals are one.

33. An apparatus as in claim 32 wherein said inverting means comprises inverters, each disposed to receive a sum generated by said second set of exclusive-OR gates which corresponds in position to a zero component of said fixed but arbitrary n-k bit signal having odd weight, whose n-k bits do not form a column of a correction matrix corresponding to said linear (n,k,4) code, and wherein said And gate means comprises an And gate.

34. An apparatus as in claim 33 wherein k, is a power of 2.

35. An apparatus as in claim 33 wherein k is 8.

36. An apparatus as in claim 33 wherein k is 16.

37. An apparatus as in claim 33 wherein k is 32.

38. An apparatus as in claim 33 wherein k is 36.

39. An apparatus as in claim 29 wherein k is a power of 2.

40. An apparatus as in claim 29 wherein k is 8.

41. An apparatus as in claim 29 wherein k is 16.

42. An apparatus as in claim 29 wherein k is 32.

43. An apparatus as in claim 29 wherein k is 36.

44. An apparatus as in claim 29 wherein said testing means is additionally for receiving said k data bit signal read from said memory, and for detecting and indicating a disparity of an even number of bit signals between said first sum signal read from said memory and said second sum signal, and for detecting and indicating a disparity of one bit signal between said first sum signal read from said memory and said second sum signal, and for correcting an error in said k data bit signal read from said memory which said disparity of one bit signal signifies.

45. An apparatus as in claim 44 wherein said coding means comprises a parity matrix.

46. An apparatus as in claim 45 wherein said addition means comprises a first set of n-k exclusive-OR gates, each of said gates of said first set generating an exclusive-OR sum of corresponding components of received signals.

47. An apparatus as in claim 46 wherein said testing means comprises:
- a second set of n-k exclusive-OR gates, each of said gates of said second set receiving and generating an exclusive-OR sum of corresponding components of said first sum signal read from said memory and said second sum signal generated by said addition means;
- inverting means, coupled to said second set of n-k exclusive-OR gates, for inverting said sums generated by said second set of exclusive-OR gates which correspond in position to zero components of said fixed but arbitrary n-k bit signal having odd weight, whose n-k bits do not form a column of a correction matrix corresponding to said linear (n,k,4) code;
- And gate means, coupled to said inverting means and said second set of exclusive-OR gates, for receiving said inverted sums, and said sums generated by said second set of exclusive-OR gates which are not inverted, and for detecting and indicating when all received signals are one; and
- a correction matrix, coupled to said second set of exclusive-OR gates, which receives said exclusive-OR sums generated by sid second set of exclusive-OR gates, receives said k data bit signal read from said memory, detects and indicates a disparity of an even number of bit signals between said first sum signal read from said memory and said second sum signal, detects and indicates a disparity of one bit signal between said first sum signal read from said memory and said second sum signal, and corrects an error in said k data bit signal read from said memory which said disparity of one bit signifies.

48. An apparatus as in claim 47 wherein said inverting means comprises inverters, each disposed to receive a sum generated by said second set of exclusive-OR gates which corresponds in position to a zero component of said fixed but arbitrary n-k bit signal having odd weight, whose n-k bits do not form a column of a correction matrix corresponding to said linear (n,k,4) code, and wherein said And gate means comprises an And gate.

49. An apparatus as in claim 48 wherein k is a power of 2.

50. An apparatus as in claim 48 wherein k is 8.

51. An apparatus as in claim 48 wherein k is 16.

52. An apparatus as in claim 48 wherein k is 32.

53. An apparatus as in claim 48 wherein k is 36.

54. An apparatus as in claim 44 wherein k is a power of 2.

55. An apparatus as in claim 49 wherein k is 8.

56. An apparatus as in claim 44 wherein k is 16.

57. An apparatus as in claim 44 wherein k is 32.

58. An apparatus as in claim 44 wherein k is 36.

* * * * *